United States Patent
Ulmer et al.

(10) Patent No.: US 7,160,745 B2
(45) Date of Patent: Jan. 9, 2007

(54) METAL-INSULATOR-METAL DEVICE

(75) Inventors: Kurt Ulmer, Corvallis, OR (US);
Jian-gang Weng, Corvallis, OR (US);
Peter Mardilovich, Corvallis, OR (US);
John Christopher Rudin, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 5 days.

(21) Appl. No.: 10/975,940

(22) Filed: Oct. 28, 2004

(65) Prior Publication Data

US 2006/0094147 A1 May 4, 2006

(51) Int. Cl.
*H01L 21/00* (2006.01)
*H01L 31/232* (2006.01)

(52) U.S. Cl. .................. 438/29; 257/432

(58) Field of Classification Search ........ 257/430–432; 438/29–31, 38, 98
See application file for complete search history.

(56) References Cited

U.S. PATENT DOCUMENTS

| | | |
|---|---|---|
| 5,142,390 A | 8/1992 | Ohta et al. |
| 5,164,850 A | 11/1992 | Tanaka et al. |
| 5,289,300 A | 2/1994 | Yamazaki et al. |
| 5,831,695 A | 11/1998 | Matsumoto |
| 5,994,748 A | 11/1999 | Inoue et al. |
| 6,008,872 A | 12/1999 | den Boer et al. |
| 6,124,606 A | 9/2000 | den Boer et al. |
| 6,225,968 B1 | 5/2001 | den Boer et al. |
| 6,243,062 B1 | 6/2001 | den Boer et al. |
| 6,285,419 B1 | 9/2001 | Inoue et al. |
| 6,350,557 B1 | 2/2002 | Aomori et al. |
| 6,384,880 B1 | 5/2002 | Inoue et al. |
| 6,424,399 B1 | 7/2002 | Shimada et al. |
| 6,480,182 B1 | 11/2002 | Turner et al. |
| 6,563,555 B1 | 5/2003 | Inoue et al. |
| 6,710,826 B1 | 3/2004 | Inoue et al. |
| 2001/0045934 A1 | 11/2001 | Turner et al. |
| 2002/0093601 A1 | 7/2002 | Inoue et al. |
| 2003/0142062 A1 | 7/2003 | Turner et al. |
| 2004/0014265 A1 | 1/2004 | Kazlas et al. |
| 2005/0202580 A1 | 9/2005 | Weng |

FOREIGN PATENT DOCUMENTS

| | | |
|---|---|---|
| JP | 62-264686 | 11/1987 |
| WO | WO 2004/059378 | 7/2004 |

OTHER PUBLICATIONS

I. Schwendeman, J. Hwang, D.M. Welsh, D.B. Tanner, J.R. Reynolds, *Combined Visible and Infrared Electrochromism Using Dual Polymer Devices*, Advanced Materials 2001, 13, No. 9, May 3, p. 634 (4 pgs.).

J. Revie, T. Nelson, *Thin-Film Transistor LCD Displays*, printed from www.cs.ndsu.nodak.edu on Jul. 26, 2004, last updated Jun. 6, 1996 (5 pgs.).

Posted in Nov. 28, 2003The Fatty Newsroom By B. P. Sydenstricker, *Plastic Promises Dense Data Store*, printed from www.fbbn.com/cgi.bin/viewnews.col on Jul. 26, 2004, Source: BBC (3 pgs.).

W. den Boer, 6.2: *A Select Line Driver for the Offset-Scan-and-Hold-Dual Select Diode AMLCDs*, SID 01 Digest, p. 44 (4 pgs.).

W. den Boer et al., *Dual Branch MIM Array Technology for Low-Cost AMLCDs*, SID 98 Digest (4 pgs.).

*Primary Examiner*—Calvin Lee

(57) ABSTRACT

A method for forming a metal-insulator-metal device includes imprinting at least one first layer to form a first impression, removing a portion of at least one second layer through the first depression to form a recess in the at least one second layer bordered by a first side, a first overhang along the first side, a second opposite side and a second overhang along the second side. The method also includes depositing a first metal in the recess spaced from the first side and the second side and oxidizing the first metal to create a non-linear dielectric.

48 Claims, 17 Drawing Sheets

METAL-INSULATOR-METAL DEVICE

BACKGROUND

Metal-insulator-metal (MIM) devices may be used in a variety of different applications such as displays. Many processes used to fabricate MIM devices may require multiple steps which are sometimes difficult to control. For example, many processes require complex, multi-step lithographic processes. In many processes, it is also difficult to control and minimize the size of the MIM device. In many processes, materials forming the MIM device are exposed to higher temperatures, limiting the use of materials that are heat resistant or that are capable of withstanding such higher temperatures. As a result, many MIM devices are relatively expensive and large.

In certain sectional views, selected lines or portions have been omitted for ease of illustration.

DETAILED DESCRIPTION OF THE EXAMPLE EMBODIMENTS

Figure 1:
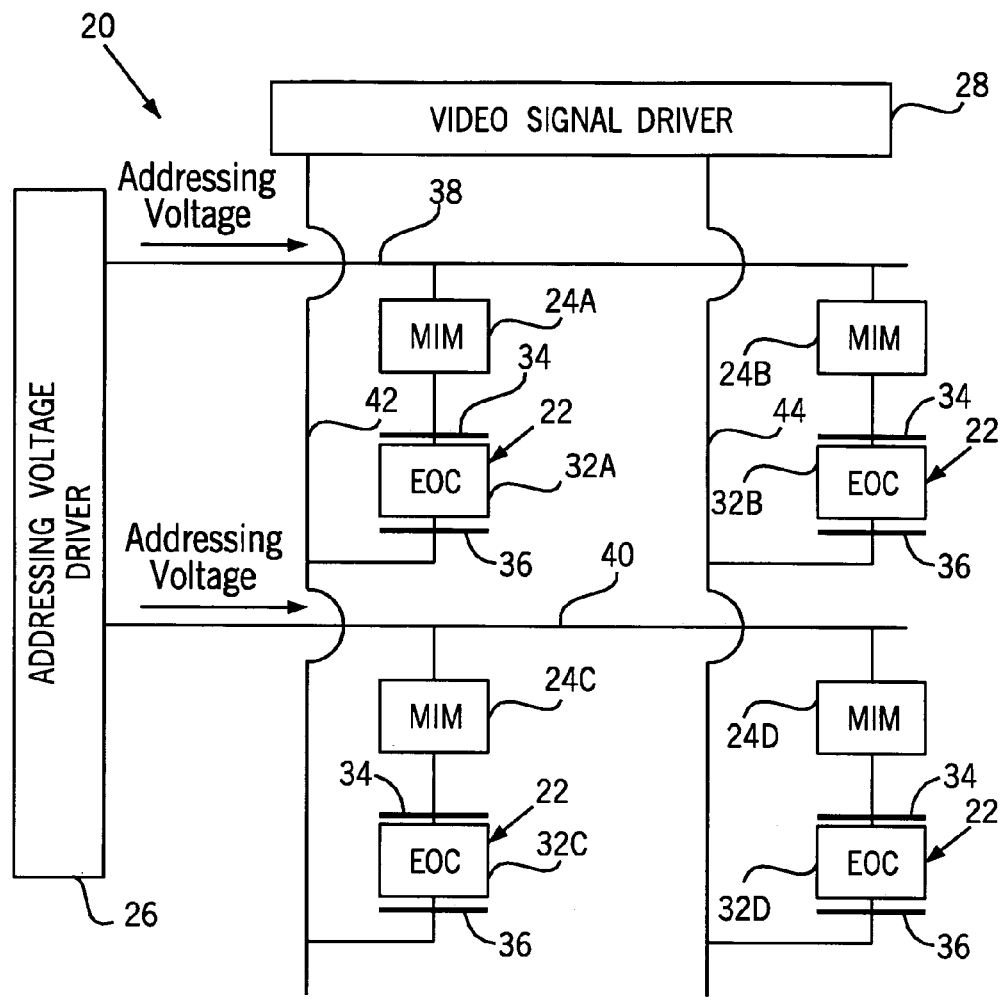
FIG. 1 is a schematic illustration of a display incorporating MIM devices according to one exemplary embodiment.

FIG. 1 is a schematic illustration of a display 20 which is shown as an active matrix electro-optical display. Display 20 generally includes electro-optical cells 22, MIM devices 24, addressing voltage driver 26, and video signal driver 28. Electro-optical cells 22 comprise individual cells arranged in a matrix or array and configured to alter or block the transmission of light to produce a visual display or image. Each cell 22 forms a pixel of display 20. Electro-optical cells 22 each generally includes an electro-optical media 32 which is configured to change light altering or blocking states in response to applied electrical charge or electrical fields. In the particular example shown, electro-optical media 32 includes liquid crystals. Each cell 22 additionally includes a pair of electrodes 34, 36 in which the electro-optical media 32 is sandwiched. In a transmissive display where a backlight is implemented, both electrodes 34 and 36 are transparent. In a reflective display, on the other hand, the electrode 36 is transparent while the electrode 34 is reflective. Electrodes 34, 36 apply an electrical field to electro-optical media 32 to selectively vary and control the light-altering or blocking nature or state of electro-optical media 32 and of cell 22.

Figure 2:
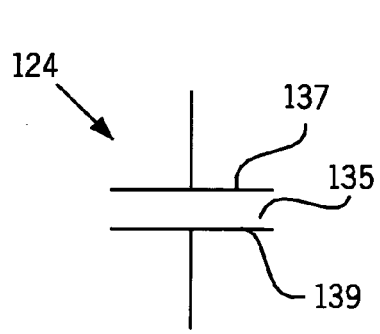
FIG. 2 is a schematic illustration of a single MIM device according to one exemplary embodiment.

MIM devices 24 can be either a single MIM device or a dual MIM device that comprises two connected single MIM devices. Each single MIM device includes a non-linear dielectric material sandwiched between a pair of electrically conductive metals. FIG. 2 schematically illustrates a single MIM device 124 which includes a non-linear dielectric 135 sandwiched between a pair of electrically conductive metals 137, 139. Because of the non-linear current/voltage characteristic, current does not flow before a threshold voltage is exceeded. Once the threshold voltage is exceeded, the MIM device presents relatively low impedance. The threshold voltage is observed in both applied polarities. Thus, the MIM devices serve as switches for selectively charging their associated electro-optical cells to produce a desired visual display. It should be noted that if the conductive metals 137 and 139 have different work functions or the interface of metal 137 and dielectric 135 is electronically different from the interface of dielectric 135 and metal 139, the single MIM device may have different threshold voltages in forward and reverse bias. Such a voltage difference may cause undesirable effects in displayed image and requires corrections in driver electronics.

Figure 3:
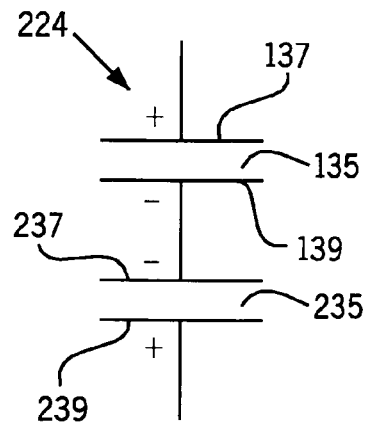
FIG. 3 is a schematic illustration of a dual MIM device according to one exemplary embodiment.

FIG. 3 schematically illustrates a dual MIM device 224 which generally comprises two connected single MIM devices. In particular, dual MIM device 224 includes non-linear dielectric materials 135 and 235 sandwiched between electrically conductive metals 137, 139 and electrically conductive metals 237, 239, respectively. As further shown by FIG. 3, the two single MIM elements or diodes are coupled in an "anti-series" arrangement such that electrically conductive metals of the same work-function are coupled to one another. In the particular example shown, the electrically conductive metals 139 and 237, having the same work function and interface to the dielectric 135 and 236 respectively, are connected together. The electrically conductive metals 137 and 239 also have the same work function and interface to the dielectric 135 and 236, respectively. This configuration provides an ability to cancel out the forward bias effects of one MIM device with the reverse bias effects of another MIM device. Dual MIM device 224 also has a reduced capacitive coupling.

Addressing voltage driver 26 comprises an electronic component configured to transmit electrical voltages to MIMs 24 via addressing lines 38, 40 as shown in FIG. 1. The addressing voltages transmitted by driver 26 represent "select" and "non-select" conditions to switch each MIM device 24 between an electrically conducting state and a non-conducting state. In one embodiment, the addressing voltages transmitted via address lines 38 and 40 may be in the form of a square wave. When the "select" condition is met, a particular MIM device 24 is turned into an electrically conducting state and its associated electro-optical material 32 may be charged based upon video signals from driver 28. Alternatively, when the "non-select" condition is met, a particular MIM device 24 is turned into a non-conducting state and its associated electro-optical media 32 is not charged or addressed by video signals from driver 28.

Video signal driver 28 comprises an electronic component configured to transmit video signals, in the form of electrical voltages, to electro-optical media 32 via video signal lines 42, 44. The video signals transmitted by driver 28 charge the electro-optical media 32 of those cells 22 that are being addressed, resulting from the associated MIM 24 being actuated to a conducting state by driver 26.

In operation according to one scenario, addressing voltage driver 26 transmits a "select" voltage to MIMs 24A and 24B via line 38 and at the same time a "non-select" voltage to MIMs 24C and 24D via line 40. As a result, MIMs 24A and 24B are actuated to conductive states, allowing electro-optical media 32A and 32B to be addressed by video signals transmitted from driver 28 via lines 42 and 44, respectively. The video signals transmitted via lines 42 and 44 may be the same or distinct from one another depending upon the display to be created.

Thereafter, addressing voltage driver 26 may transmit a "non-select" voltage to MIMs 24A and 24B via line 38 and at the same time a "select" voltage to MIMs 24C and 24D via line 40. As a result, MIMs 24C and 24D are actuated to conductive states, allowing electro-optical media 32C and 32D to be addressed and charged in response to receiving video signals from video signal driver 28 via lines 42 and 44, respectively. Once again, the video signals being transmitted via lines 42 and 44 may be the same or may be different depending upon the image being created. Upon being charged, electro-optical media 32A, 32B, 32C and 32D hold their respective states as other cells 22 and electro-optical media 32 are addressed. This process is generally repeated until an entire matrix or array of cells 22 is addressed and actuated to achieve a desired optical output.

Figure 4:
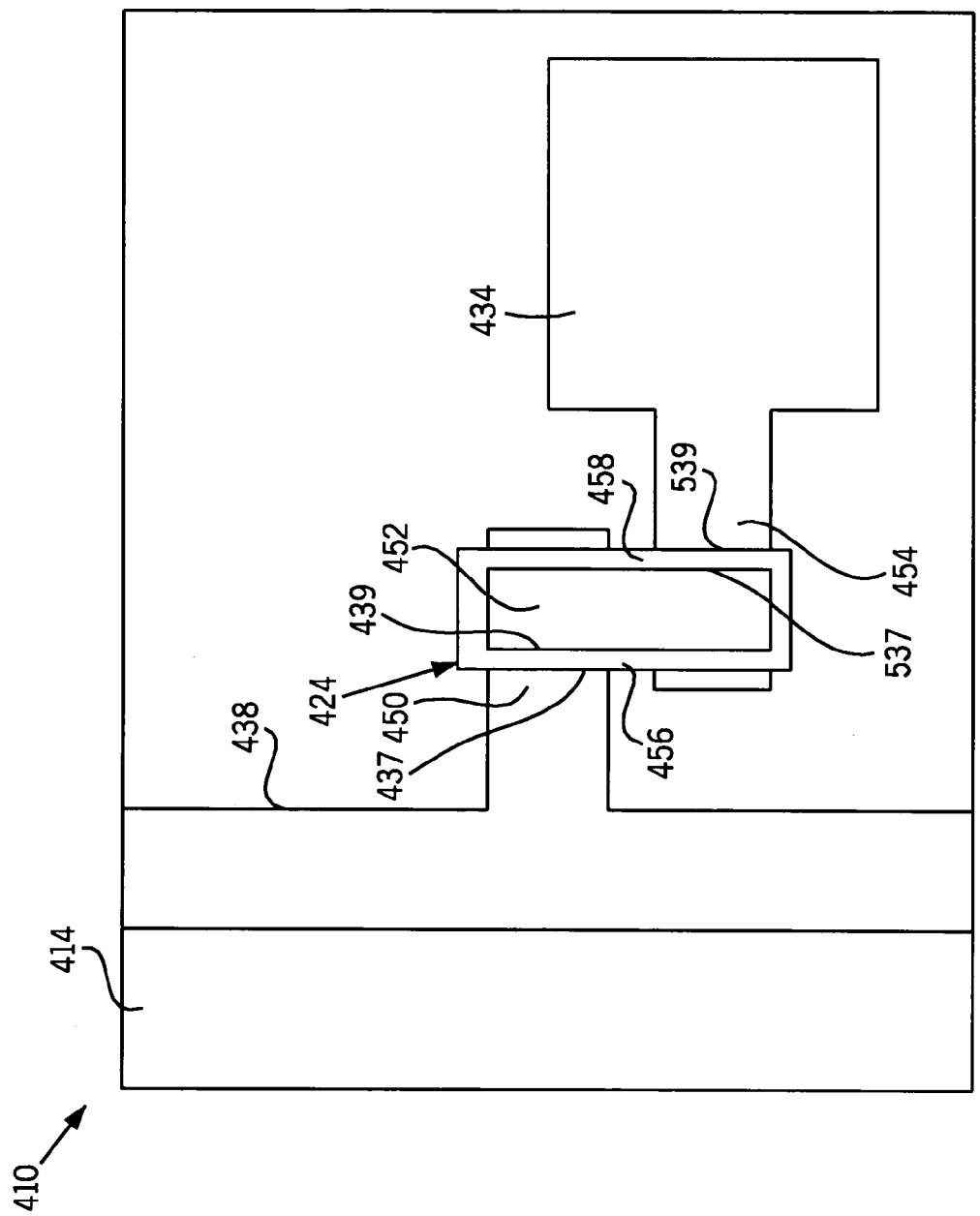
FIG. 4 is a top plan view of a MIM backplane according to one exemplary embodiment.

FIG. 4 is a top plan view of one example of a MIM backplane 410 for an individual pixel of a display such as display 20. Backplane 410 includes display substrate 414, the addressing voltage bus line 438, dual MIM device 424, and electrode 434. Display substrate 414 generally comprises a structure supporting the bus line 438, dual MIM device 424, and electrode 434. Substrate 414 is generally formed from dielectric material such as glass or a flexible plastic or polymer. Examples of a flexible plastic or polymer that may be used include polyethylene terephthalate (PET) or polyethylene naphthalate (PEN). In other embodiments, one or more other materials may be used for forming substrate 414. Substrate 414 is generally adhered or bonded to the bus line 438, dual MIM device 424, and electrode 434 by an adhesive such as NOA 81 by Norland Products, Inc. In the particular example shown, substrate 414 has a thickness of between about 50 micrometers and 200 micrometers. The thickness of the adhesive layer extending between substrate 414 and the remaining components of backplane 410 is between about 5 micrometers and 20 micrometers. In other embodiments, the bus line 438, dual MIM device 424, and electrode 434 may be coupled to substrate 414 in other fashions without the use of adhesive.

The bus line 438 comprise electrically conductive traces or lines electrically coupled to addressing voltage driver 26 (shown in FIG. 1). Bus line 438 is electrically coupled to MIM device 424. The line 438 transmits the addressing voltages from driver 26 to MIM devices 424 to actuate or bias such a MIM device between conducting and non-conducting states.

In the particular embodiment shown in FIG. 4, the MIM device 424 is a dual-MIM devices, such as the dual-MIM device 224 schematically shown in FIG. 3. MIM device 424 is electrically connected between bus line 438 and electrode 434 and includes conductive metal portions 450, 452, 454 and non-linear dielectric portions 456 and 458. Metal portions 450 and 452 have boundary areas 437 and 439 between which is sandwiched non-linear dielectric 456. Conducting metal portion 452 and 454 have boundary portions 537 and 539 which are both in contact with non-linear dielectric 458. Metal portion 450 is in electrical contact with address bus line 438. Metal portion 454 is in electrical contact with electrode 434. Upon the transmission of a "select" voltage to MIM device 424, non-linear dielectrics 456 and 458 become electrically conductive, allowing current to flow with little impedance through MIM device 424 to electrode 434. Thus the MIM device 424 serves as a switch, enabling electrode 434 and the associated electro-optical material 32 (shown in FIG. 1) to be selectively addressed depending upon the addressing voltage transmitted via the bus line 438.

Figure 5:
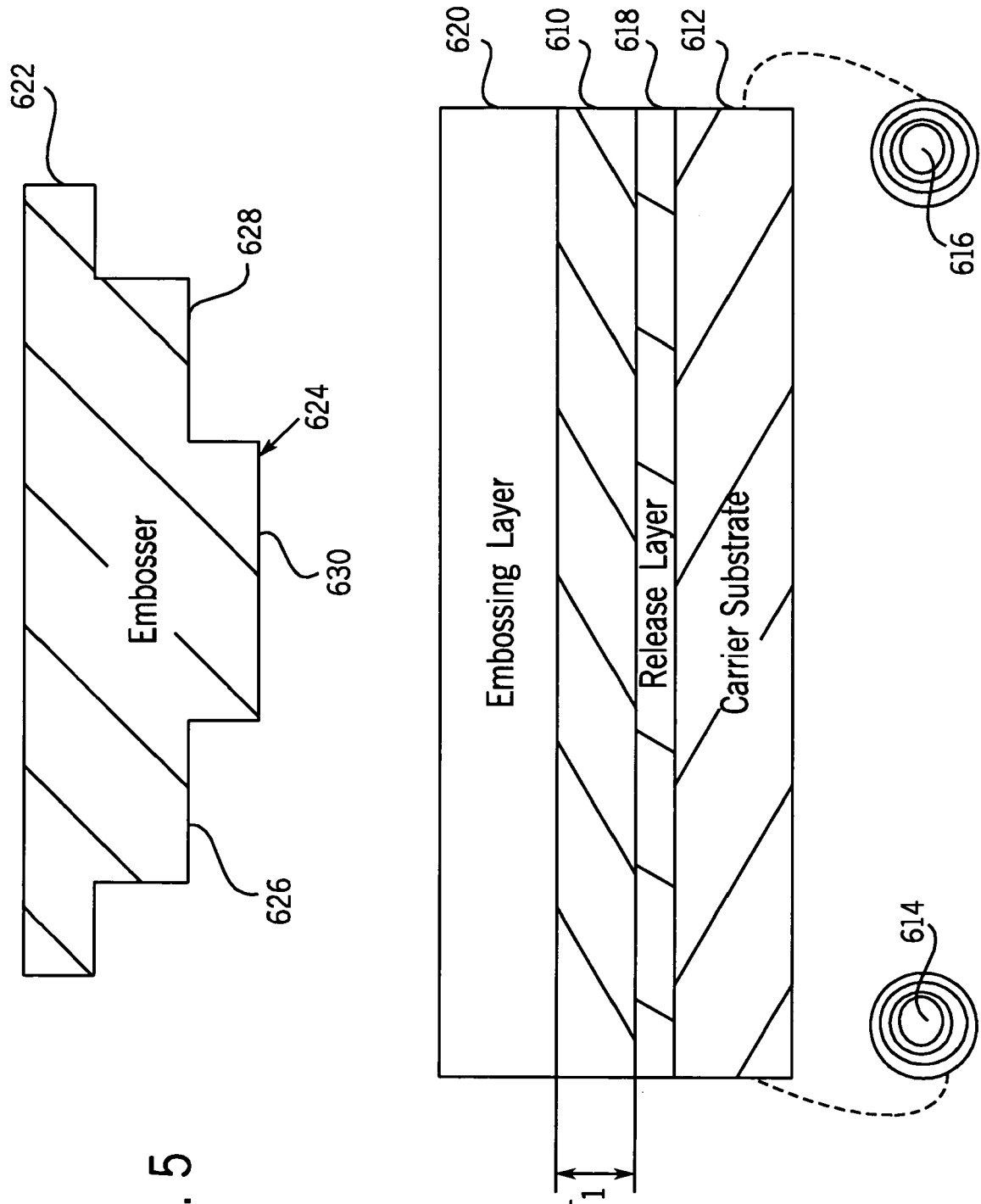
FIG. 5 is a sectional view schematically illustrating coupling of an embossing layer and a sacrificial layer upon a carrier substrate according to one exemplary embodiment.

FIGS. 5–18 illustrate one example of a method for fabricating backplane 410. The method shown in FIGS. 5–18 utilizes macro-area processing techniques and does not require photolithography, reducing the complexity and cost for the fabrication of backplane 410. As shown in FIG. 5, an embossing layer 620 and a sacrificial layer 610 are coupled to carrier substrate 612. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. Embossing layer 620 comprises a layer of one or more materials such that the layer may be embossed or imprinted upon by an embosser such as an embossing shim 622.

Sacrificial layer 610 comprises a layer of one or more dielectric organic materials configured to be later removed or sacrificed in the formation of backplane 410. Sacrificial layer may comprise any material having a differential etch rate. In one embodiment, sacrificial layer 610 comprises a positive photoresist that, after exposure to UV radiation, can be dissolved by a solvent. In another embodiment, sacrificial layer 610 comprises a negative photoresist that may need much higher UV radiation dosage to be fully cured than that needed by the embossing layer 620. In both cases, the sacrificial layer 610 can be partially dissolved away by a solvent after the embossing layer 620 is fully cured. In the specific example illustrated, sacrificial layer 610 has a relatively small thickness $T_1$ of less than 2 micrometers. In other embodiments, sacrificial layer 610 may comprise doped semiconductors and metals.

Carrier substrate 612 comprises an electrically conductive substrate configured to support sacrificial layer 610. In the example shown, carrier substrate 612 is provided as part of a roll-to-roll process, wherein carrier substrate 612 is wrapped about the reels 614, 616. A carrier substrate may be formed from one or more conductive materials such as copper or nickel with a highly smooth surface finish and high conductivity. Carrier substrate 612 may comprise a bulk conductor, such as a metal plate or sheet, or may comprise a dielectric sheet with a conducting surface layer.

According to one exemplary embodiment, carrier substrate 612 is passivated to form a thin release layer 618. For example, the conducting surface of carrier substrate 612 may be treated with 0.1 N potassium dichromate aqueous solution for 10 minutes, followed by rinsing and drying. Release layer 618 may be a very thin oxide, a surfactant layer or a monolayer polymer release agent. In those embodiments including release layer 618, sacrificial layer 610 is formed upon the release layer 618. Release layer 618 is substantially conductive.

As further shown by FIG. 5, an embossing layer 620 is deposited upon sacrificial layer 610. Embossing layer 620 comprises a layer of one or more materials such that the layer may be embossed or imprinted upon by an embosser such as an embossing shim 622.

Figure 6:
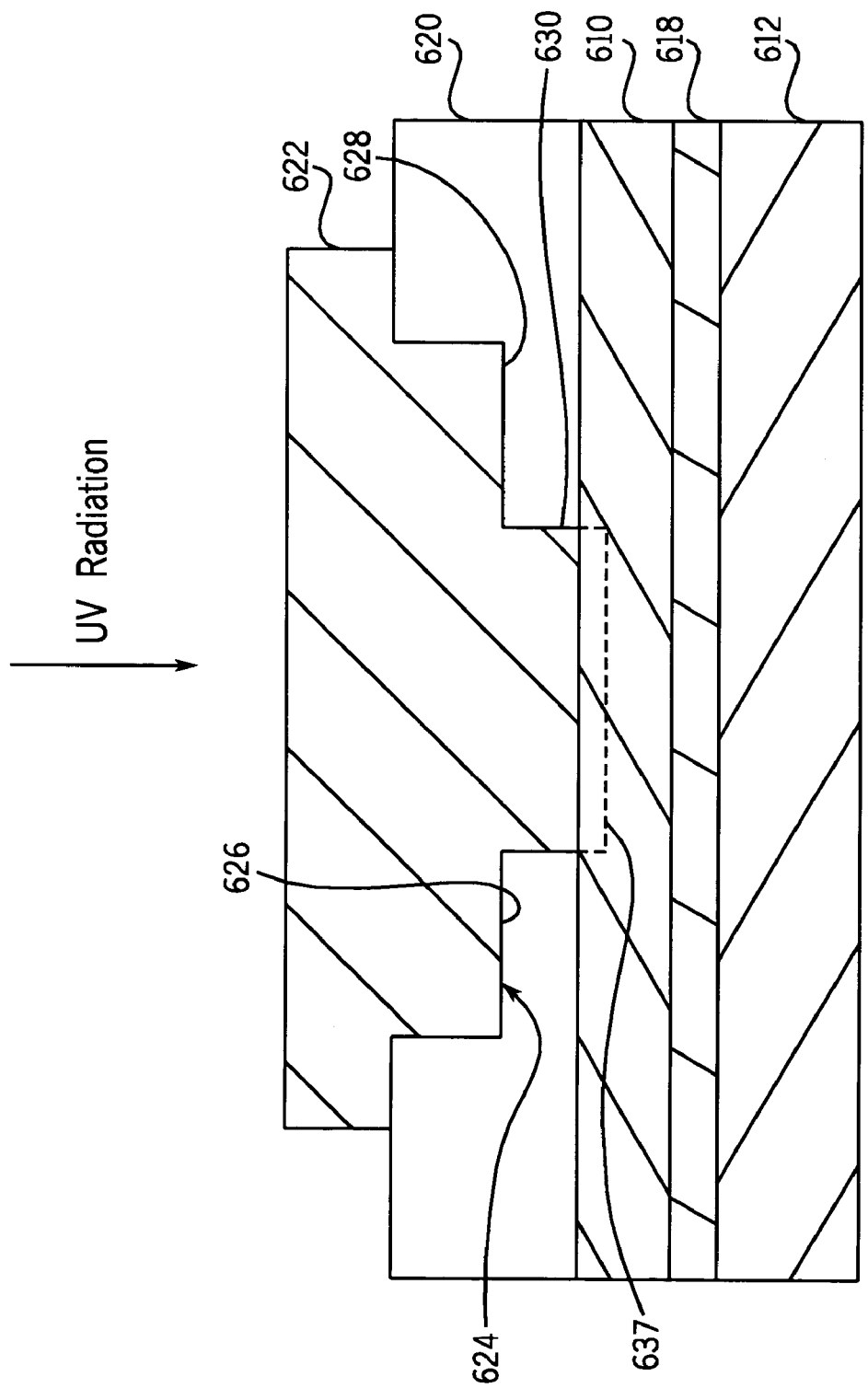
FIG. 6 is a sectional view schematically illustrating embossing or imprinting of the at least one embossing layer according to one exemplary embodiment.
Figure 7:
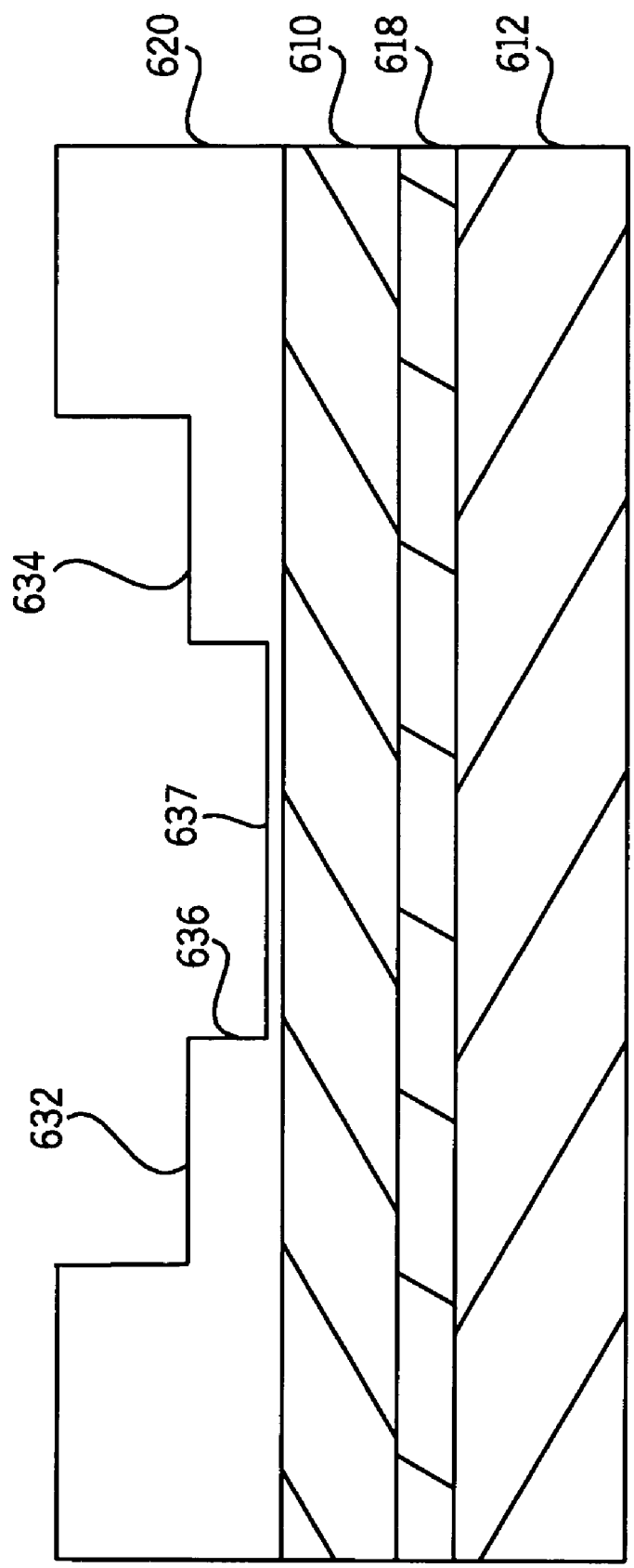
FIG. 7 is a sectional view schematically illustrating the imprinted embossing layer having a formed channel according to one exemplary embodiment.

FIGS. 6 and 7 illustrate the embossing or imprinting upon of embossing layer 620 by embosser 622. As shown by FIG. 6, embosser 622 includes a surface relief 624. Surface relief 624 is configured to form features within embossing layer 620 corresponding to address line 438 and MIM device 424. In the particular example shown, relief surface 624 includes projections 626, 628 and 630. Projection 626 forms a channel 632 within embossing layer 620 which generally corresponds to the outline of address line 438 and metal portion 450. Projection 628 embosses or imprints a channel 634 within layer 620 which generally corresponds to the outline or shape of metal portion 454. Projection 630 is configured so as to project into layer 620 so as to form channel 636 which generally has a shape or outline of the boundaries 439, 537 between metal portion 450 and metal portion 454 as shown in FIG. 4. As indicated by broken line 637 in FIG. 6, projection 630 may alternatively extend into sacrificial layer 610 so as to also emboss sacrificial layer 610.

In the particular example shown, embossing layer 620 is formed from one or more materials such that embossing layer 620 has a deformable shape until treated. In the particular example shown, embossing layer 620 comprises an optically transparent UV curable dielectric resin (e.g., Norland Optical Products NOA83H). As a result, upon the application of UV illumination, the shape of embossing layer 620 becomes stabilized. In the particular example shown, embosser 622 is substantially transparent to UV wavelengths. Once embosser 622 has been positioned into layer 620 such that layer 620 takes up the form or shape of release surface 624 as shown in FIG. 6, UV illumination is applied through embosser 622 to embossing layer 620 to cure and solidify or stabilize the shape of embossing layer 620 while embosser 622 is in place. Thereafter, as shown in FIG. 7, embosser 620 is separated from layer 620 to expose and reveal channels 632, 634 and 636.

In other embodiments, embossing layer 620 may comprise one or more other materials such that embossing layer 620 may be treated to stabilize the shape of embossing layer 620 by other means such as by heat, chemical reactions, thermosetting reactions, curing or cross-linking, induction heating, microwave and other forms of electromagnetic radiation and the like, while embosser 622 is positioned into layer 620 or upon removal of embosser 622 from layer 620. In still other embodiments, embossing layer 620 may be provided by other materials which do not require treatment to achieve a stabilized shape or which require treatment to achieve a deformable state which naturally stabilizes and shapes over time or which may require further treatment for shape stabilization. Although in the particular example illustrated, embossing layer 620 is formed from one or more transparent materials, in other embodiments, embossing layer 620 may alternatively be opaque such as in those embodiments in which at least those portions of embossing layer 620 which overlie or underlie electrical optical media 32 (shown in FIG. 3) are removed during the manufacture of the display in which backplane 410 is to be used.

Figure 8A:
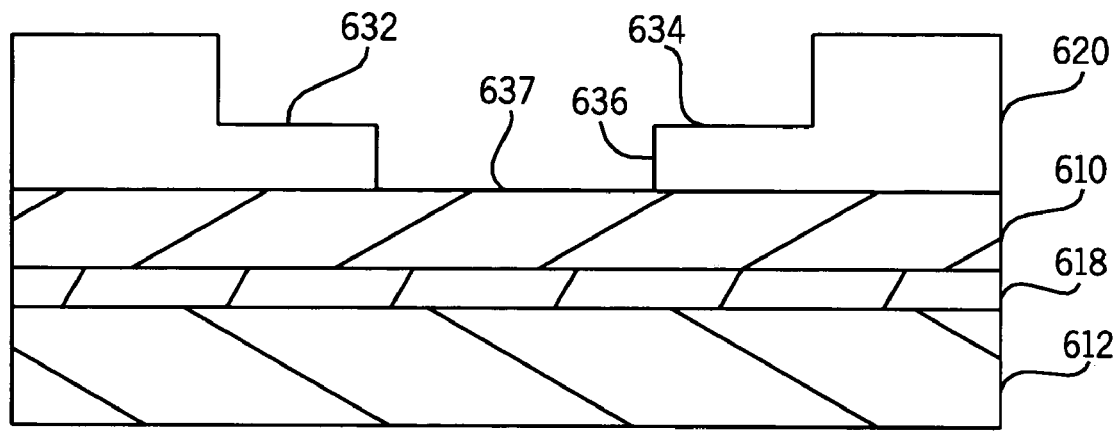
FIG. 8A is a sectional view illustrating exposing of the sacrificial layer through the channel according to one exemplary embodiment.
Figure 8B:
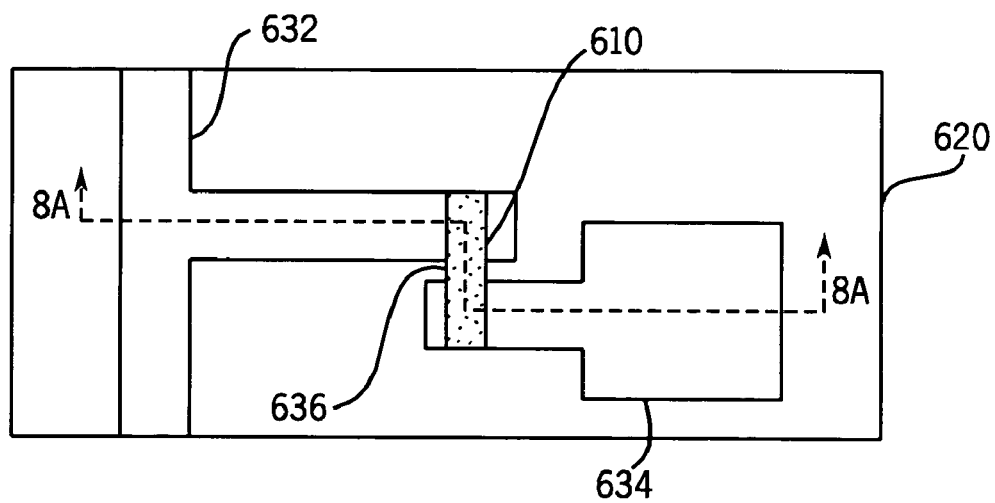
FIG. 8B is a top plan view of the layer of FIG. 8A according to one exemplary embodiment.

FIGS. 8A and 8B illustrate further deepening of channel 636 so as to expose sacrificial layer 610. In particular, floor 637 (shown in FIG. 8A) of channel 636 is removed. Floor 637 may be desirable in those particular applications where underlying areas produce topography of sacrificial layer 610, embossing layer 620 or both. In particular applications, underlying portions of sacrificial layer 610 may also be removed with floor 637. Examples of methods that may be used to remove floor 637 so as to deepen channel 636 and expose layer 610 include oxygen plasma etching, UV-ozone treatment and laser ablation for those embodiments using polymers. For those embodiments using other materials for sacrificial layer 610, such as metals and doped semiconductors, other methods may be used to remove floor 637 and to deepen channel 636 to expose layer 610 such as reactive ion etching, wet etching or ion beam milling. In particular applications, the embossing or imprinting of layer 620 may be performed such that channel 636 omits a floor 637 and exposes layer 610.

Figure 9:
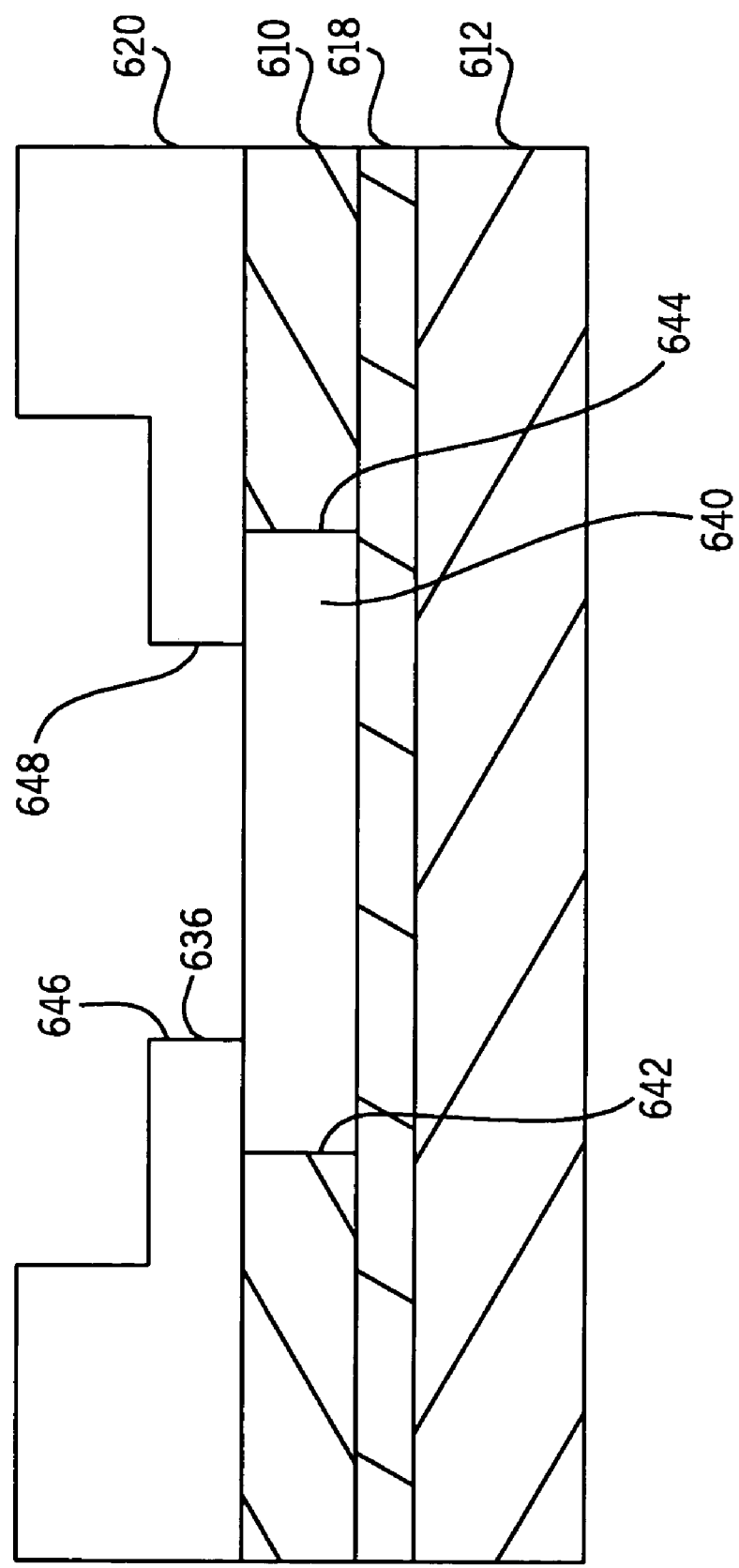
FIG. 9 is a sectional view illustrating removal of portions of the sacrificial layer through the channel to form a recess having first and second side edges according to one exemplary embodiment.

FIG. 9 illustrates removal of portions of sacrificial layer 610 through depression 636 to form a recess 640 within sacrificial layer 610. Recess 640 is bordered by side edges 642, 644. As further shown by FIG. 9, portions of layer 610 are removed so as to additionally form overhangs 646, 648 along sides 642 and 644, respectively. Overhangs 646, 648 are provided by portions of the material of embossing layer 620 extending over recess 640 along a depression or channel 636. In particular embodiments, portions of overhangs 646, 648 may also include portions of layer 610.

In the particular example illustrated, portions of sacrificial layer 610 are removed by wet or dry etching. Other material removal techniques may alternatively be utilized depending upon the materials of sacrificial layer 610.

Figure 10:
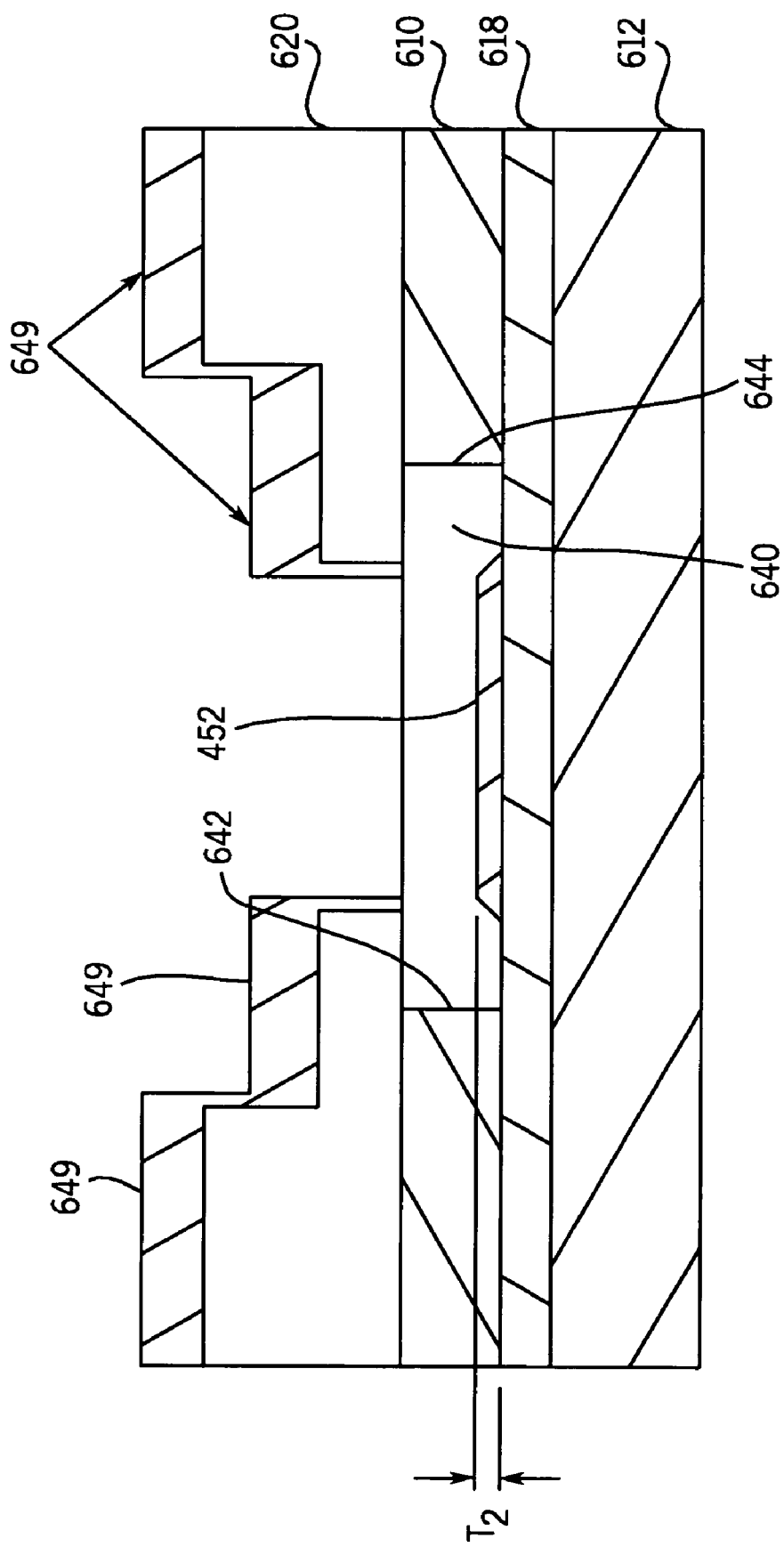
FIG. 10 is a sectional view illustrating deposition of a first metal in the recess and spaced from the first and second side edges according to one exemplary embodiment.

FIG. 10 illustrates depositing metal portion 452 in recess 640. As shown by FIG. 10, the metallic material being deposited to form metal portion 452 may cover or coat at least portions 649 of embossing layer 620. Overhangs 646 and 648 substantially hinder the metallic material from becoming deposited upon side edges 642 and 644. Overhangs 646 and 648 create a discontinuity between portion 452 and material deposited upon portions 649. In addition, overhang 646 and 648 enable metal portion 452 to be deposited within recess 640 while being spaced from side edges 642 and 644. As a result, the deposition and patterning of metal portion 452 may be performed with less expensive deposition techniques and is easier to control.

In the example shown in FIG. 10, the metallic material of portions 649 and metal portion 452 may be deposited using such methods as thermal evaporation and sputtering. The material on portions 649 and forming metal portion 452 comprise tantalum. In other embodiments, the metallic material may comprise other metals whose oxides function as non-linear dielectrics such as niobium, titanium, copper, silver, aluminum, and their alloys. In the particular example shown, metal portion 452 has a minimum thickness $T_2$ of at least 50 nm to provide sufficient material for anodization (shown in the next step) and sufficient conductivity to allow electrical current flow when the MIM device 424 is in a conducting state and a maximum thickness not exceeding the thickness of the sacrificial layer such that a lift-off process may be implemented. In the particular example shown, metal portion 452 has a thickness $T_2$ of 100 nm. In other embodiments, metal portion 452 has other thicknesses.

Figure 11:
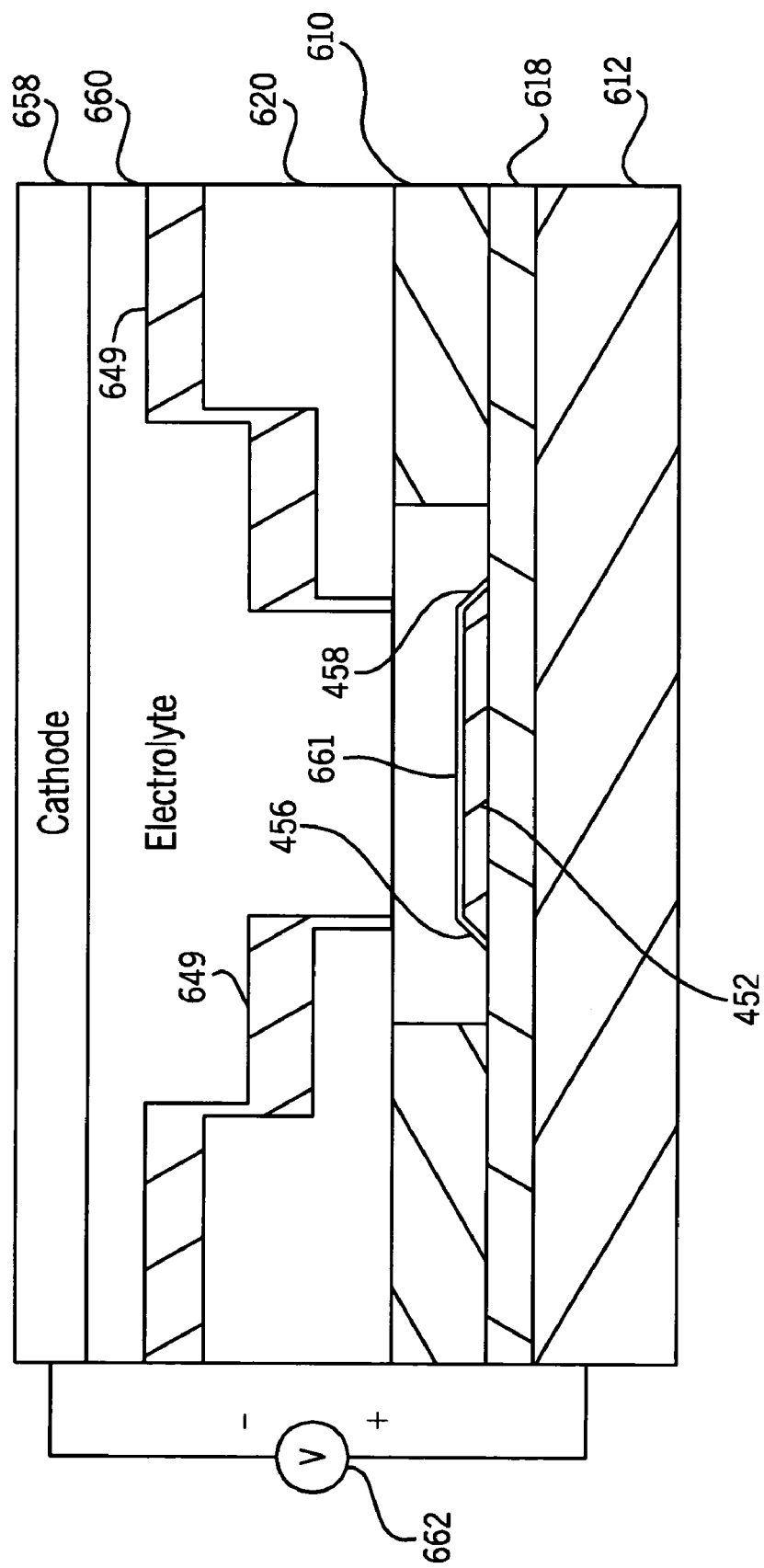
FIG. 11 is a sectional view schematically illustrating anodization of the first metal within the recess to form non-linear dielectric portions according to one exemplary embodiment.

FIG. 11 illustrates anodization of metal portion 452 to form non-linear dielectric layer 661 providing portions 456 and 458. Those portions of metal portion 452 that are not anodized or oxidized remain electrically conductive. In particular, metal portion 452 is anodized using a galvanic cell utilizing conducting substrate 612 as an anode, a cathode 658 of a suitable metal, such as platinum and a suitable electrolyte 660. In the example shown, the electrolyte may comprise a citric acid. In other embodiments, electrolyte 660 may comprise a boric acid solution with pH adjusted to 7 by $NH_4OH$, ammonium tartrate, ammonium borate. Electrolyte 660 may also include other surfactants and/or buffer materials.

In the particular example shown in which metal portion 452 comprises tantalum having an anodization coefficient of approximately 1.9 nm/volt, voltage source 662 applies a starting current density of approximately 0.2 mA per centimeter squared. Voltage source 662 applies a relatively constant voltage using a potentiostatic technique to complete anodization of metal portion 452. The voltage applied by voltage source 662 and the time that the anodization is performed at constant voltage determines the thickness of non-linear dielectric portions 456 and 458 and the final threshold of MIM device 424 (shown in FIG. 15). In the particular example shown, voltage source 662 applies a generally constant voltage of 35 volts for 30 minutes at the final stage which results in non-linear dielectric portions 456 and 458 having a thickness of approximately 65 nm (456 and 458 are in the same layer). In other embodiments, the voltage applied by voltage source 662 may be varied to vary the thickness of non-linear dielectric portions 456 and 458. Because the portion 649 is electrically disconnected from the carrier substrate, no anodization occurs and no oxide forms there.

Figure 12:
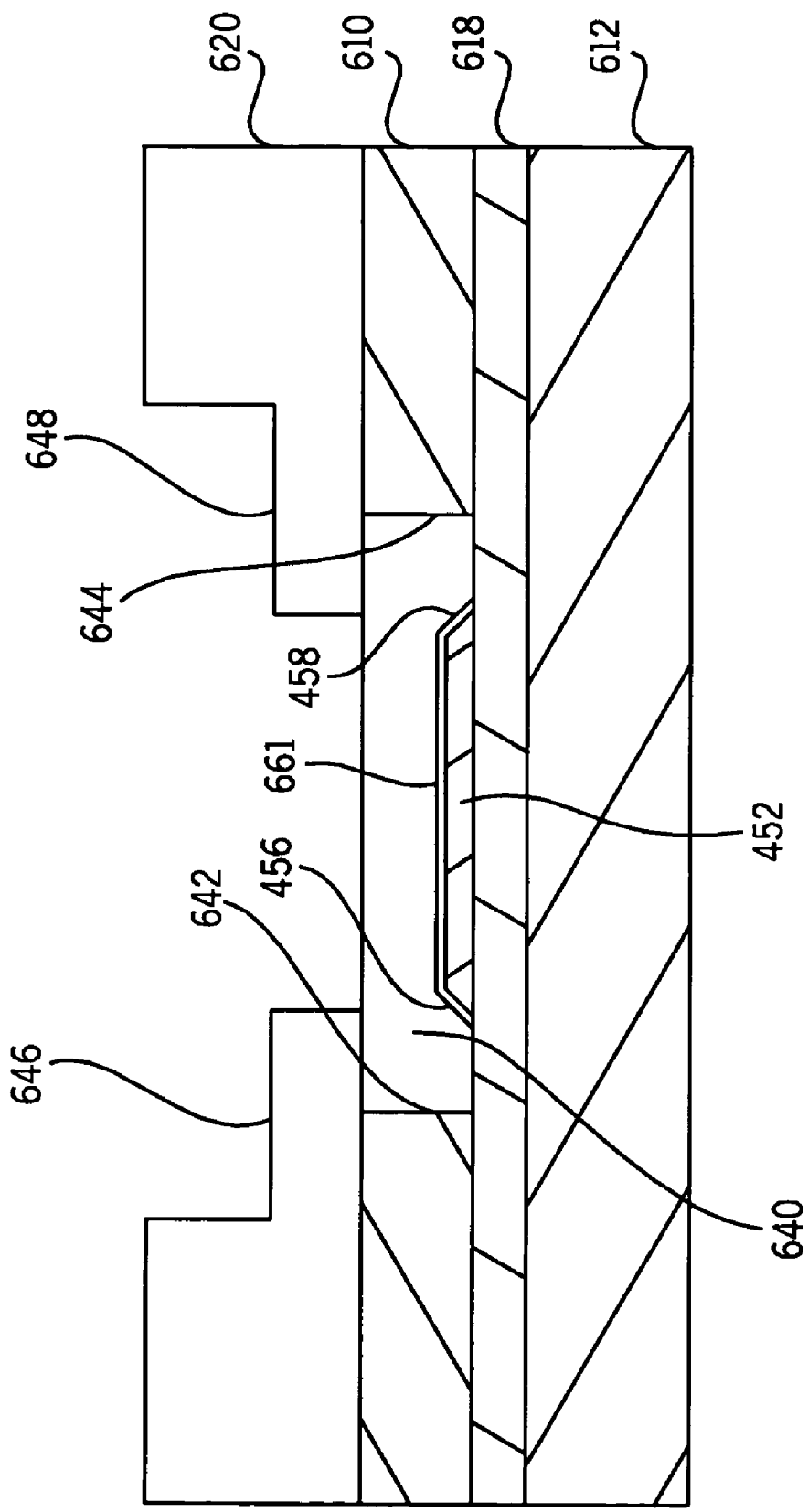
FIG. 12 is a sectional view illustrating removal of the first metal from the embossing layer according to one exemplary embodiment.

FIG. 12 illustrates removal of metallic material 649 (shown in FIG. 11) from portions of embossing layer 620. In the particular example shown, metallic material 649 is removed by etching such as with a dry etch or a wet etch. The etching technique chosen provides a sufficient differential etch rate between the metallic material 649 and the non-linear dielectric material of portions 456 and 458. In the particular example shown, removal of metal 649 can be achieved by wet-etching using acid based solvents such as the solvent consisting of 1 part 48% HF, 2 parts concentrated HNO3, and 1 part H2O. Alternatively, removal of metal 649 can be achieved by using dry-etching under CF4 plasma.

Figure 13A:
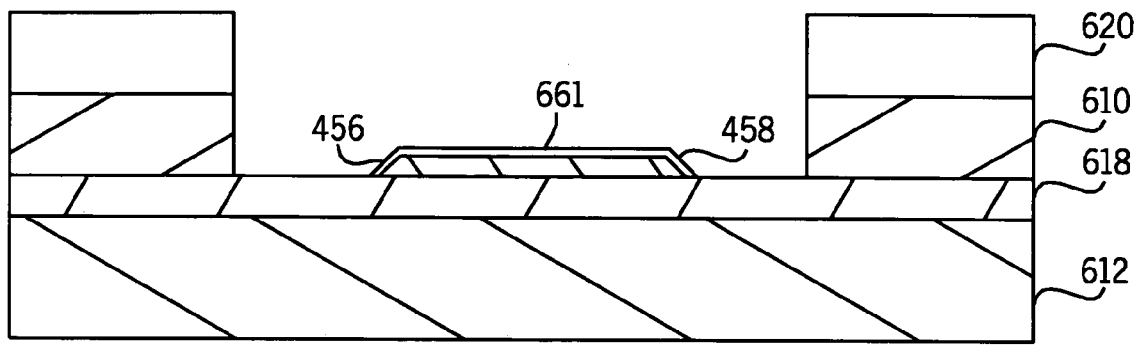
FIG. 13A is a sectional view illustrating further removal of portions of the embossing layer and the sacrificial layer according to one exemplary embodiment.
Figure 13B:
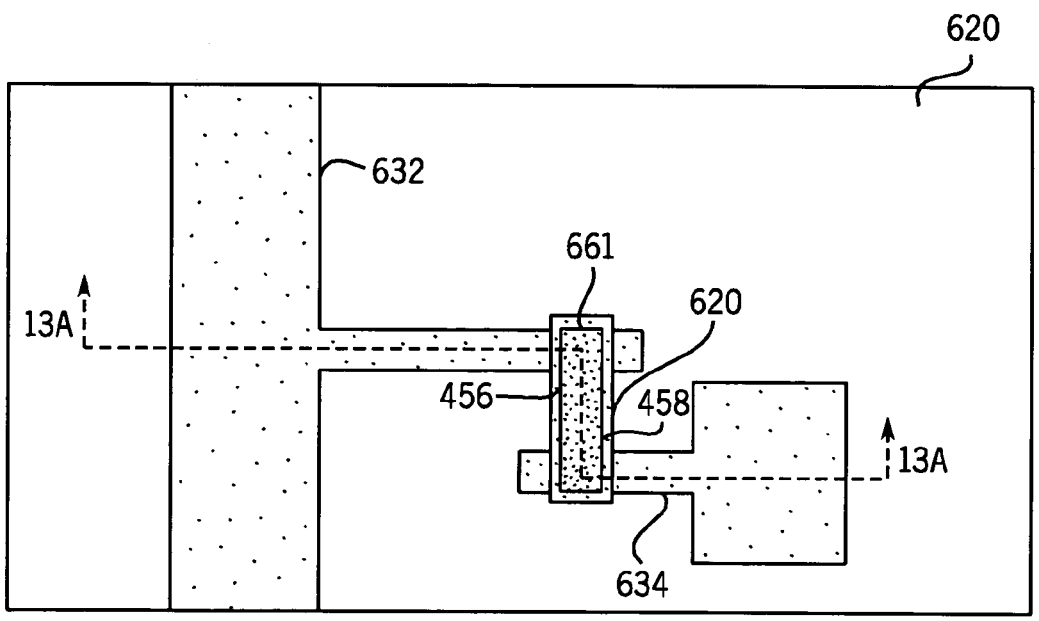
FIG. 13B is a top plan view of the layers of FIG. 13A according to one exemplary embodiment.

FIG. 13A illustrates further removal of portions of embossing layer 620 and sacrificial layer 610 to expose carrier substrate 612 and/or release layer 618. In particular, portions of embossing layer 620 and sacrificial layer 610 are removed using the same methods (including oxygen plasma etching, UV-ozone treatment and laser ablation) that are used to remove floor 637 of channel 636 in FIG. 8A. The removal of material results in channels 632 and 634 in embossing layer 620, initially formed by imprinting as shown in FIGS. 8A and 8B, being deepened such that channels 632 and 634 extend through sacrificial layer 610 to release layer 618 or carrier substrate 612 shown in FIG. 13B.

Figure 14:
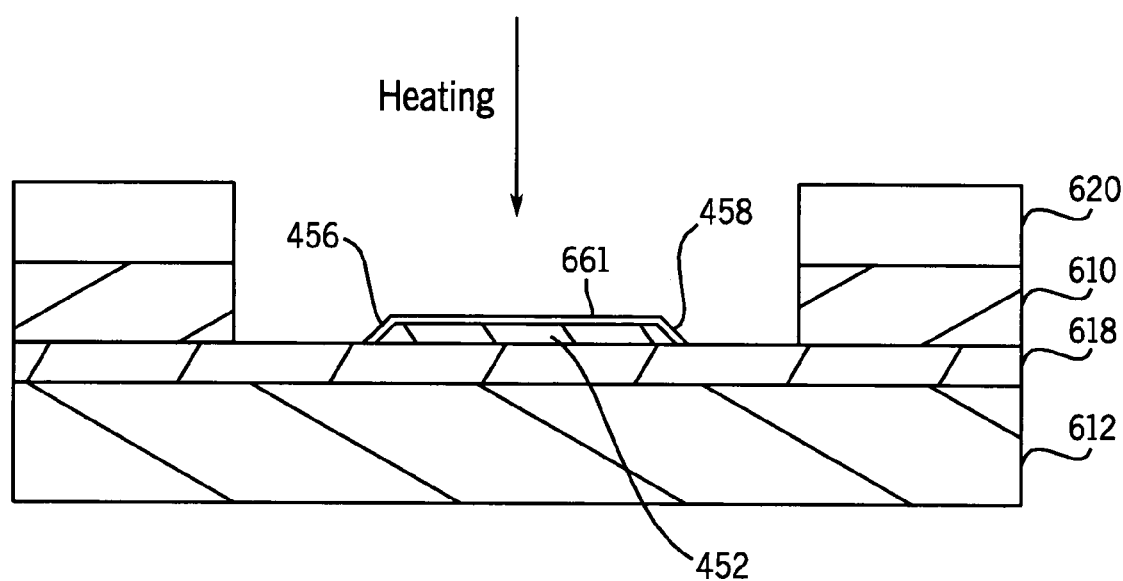
FIG. 14 is a sectional view illustrating annealing of the non-linear dielectric portions according to one exemplary embodiment.

FIG. 14 illustrates heat being applied to non-linear dielectric portions 456 and 458 to anneal portions 456 and 458. Annealing of portions 456 and 458 improves electrical performance of MIM device 424 (shown in FIG. 15A) by reducing current leakage.

Figure 15A:
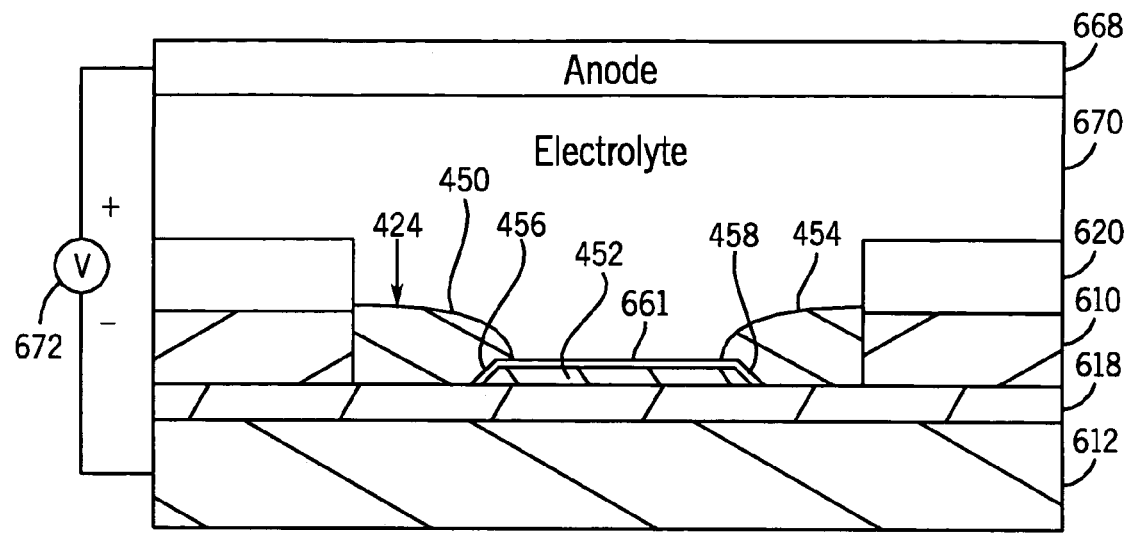
FIG. 15A is a sectional view schematically illustrating forming of a second metal on a first portion of the non-linear dielectric and forming of a third metal on a second portion of the non-linear dielectric according to one exemplary embodiment.
Figure 15B:
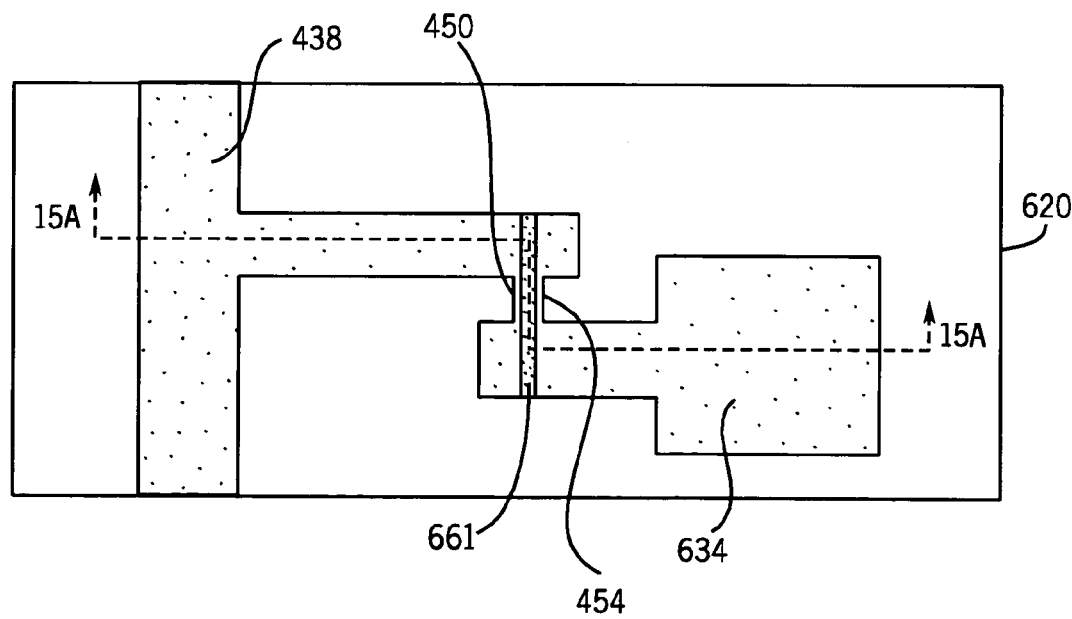
FIG. 15B is a top plan view of the layers of FIG. 15A according to one exemplary embodiment.

FIGS. 15A and 15B illustrate forming address line 438 and metal portions 450 and 454. In particular, metallic material is deposited within channels 632 and 634 (shown in FIG. 7). As its thickness increases, the metal layer will extend horizontally and cover some portions within channel 636 upon non-linear dielectric portions 456 and 458 to form metal portions 450 and 454. The deposition timing should be controlled such that the areas where the metal portions 450 and 454 overlap with non-linear dielectric portions respectively reach the design value. It should also be noted that metal portions 450 and 454 are spaced from one another and are electrically isolated from one another by non-linear dielectric portions 456 and 458.

Figure 17:
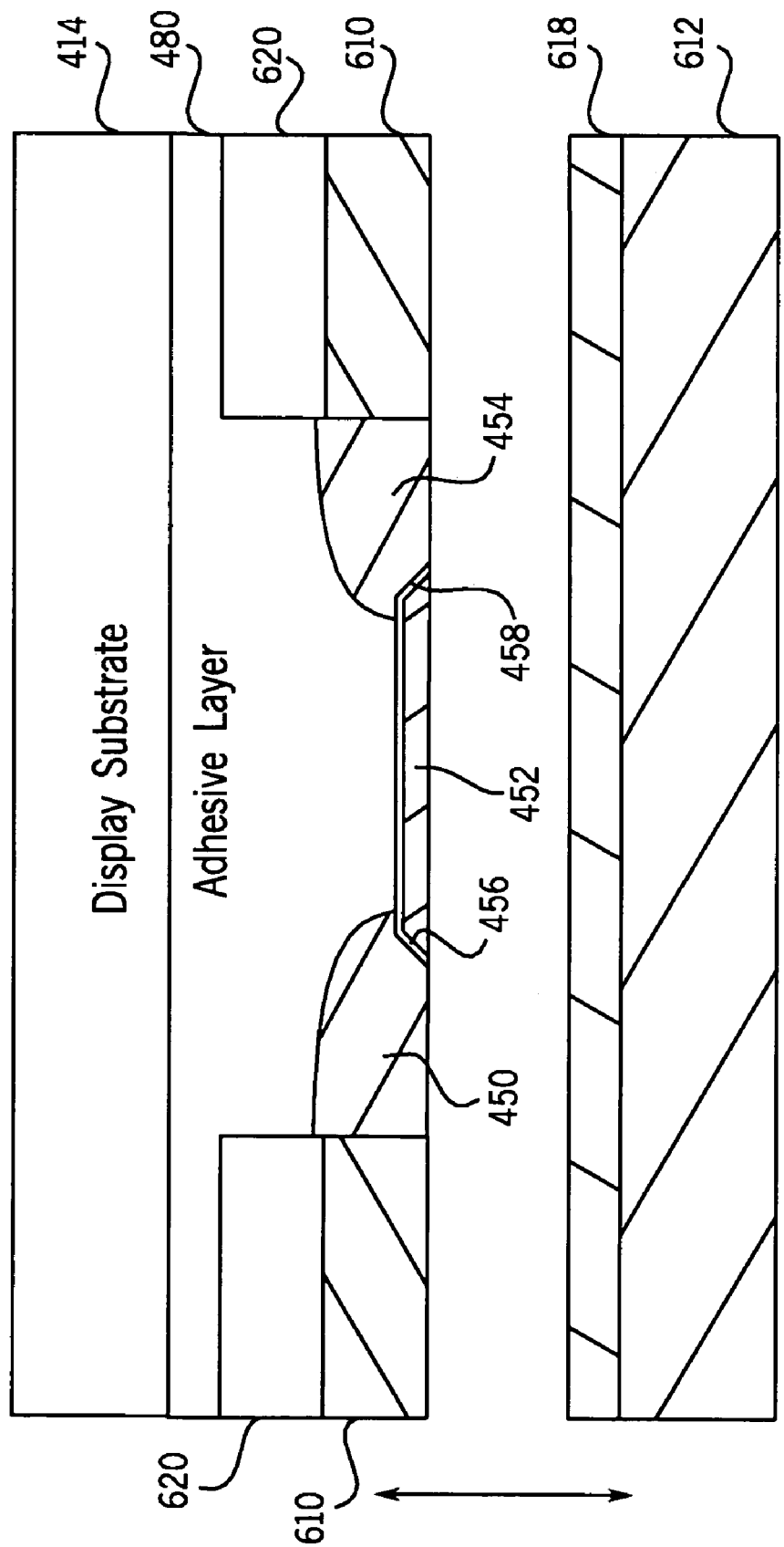
FIG. 17 is a sectional view illustrating separation of the carrier substrate according to one exemplary embodiment.

In the particular example shown, the metals forming address line 438 and metal portions 450 and 454 are deposited by electro-deposition or electroplating. As shown by FIG. 15A, the electroplating is performed by using electrically conductive carrier substrate 612, conductive release layer 618 as a cathode, an anode 668 of suitable material such as platinum or nickel, an electrolyte 670 and a voltage source 672. Electrolyte 670 includes selective additives which in conjunction with the voltage applied by voltage source 672 result in metal portions 450 and 454 partially extending over and in contact with non-linear dielectric portions 456 and 458 as thickness of metal portions 450 and 454 increases. The voltage applied by voltage source 672 is maintained below the voltage threshold of non-linear dielectric portions 456 and 458 such that portions 456 and 458 remain insulating. As a result, little or no metallic material is deposited between non-linear dielectric portions 456 and 458 such that metal portions 450 and 454 remain electrically isolated from one another after the separation of carrier substrate 612 and release layer 618 (as shown in FIG. 17 hereafter). In particular embodiments, if the electroformed metallic materials of metal portions 450 and 454 do not sufficiently adhere to non-linear dielectric portions 456 and 458, a thin layer of adhesive metal may be deposited upon non-linear dielectric portions 456 and 458 prior to electroforming of metal portions 450 and 454. In such a scenario, the adhesive metal in those areas not subsequently covered by metal portions 450 and 454 may be removed by laser ablation or etching.

In the particular example shown, metal portions 450 and 454 comprise one or more metals that are capable of electrochemical deposition with good conductivity such as nickel, copper, silver and gold. Metal portions 450 and 454 have a thickness of no greater than the combined thicknesses of the embossing layer 620 and the sacrificial layer 610. In other embodiments, other techniques may be employed for depositing the metallic material of metal portions 450 and 454. In other embodiments, metal portions 450 and 454 may have thicknesses greater than 10 micrometers.

Figure 16:
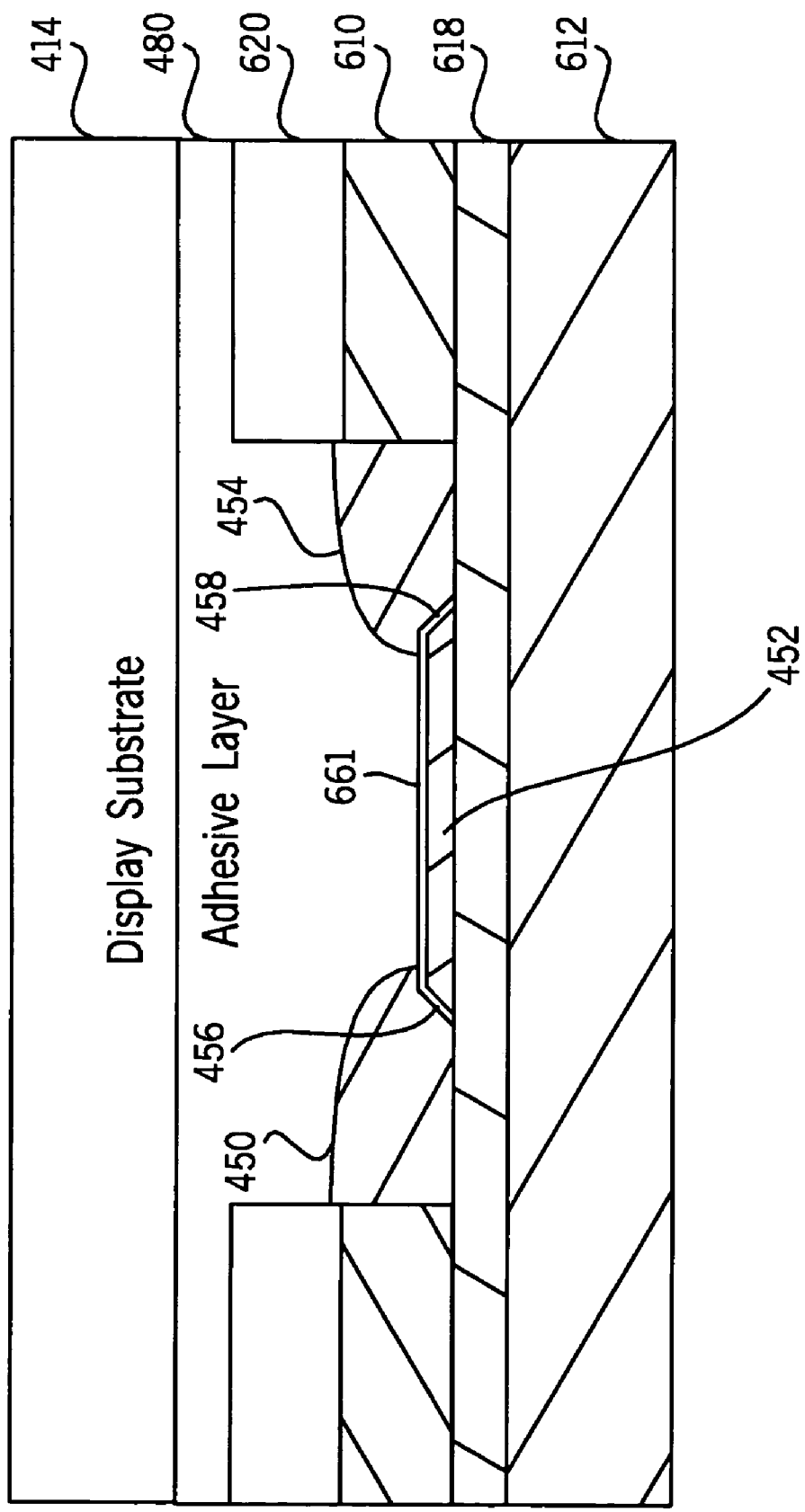
FIG. 16 is a sectional view illustrating the coupling of a display substrate according to one exemplary embodiment.

FIG. 16 illustrates coupling of a display substrate to address line 438, metal portion 450, metal portion 454, non-linear dielectric portions 456, 458 and metal portion 452. According to one exemplary embodiment, display substrate 414 is coupled to address line 438 and MIM device 424 by adhesive layer 480. According to one embodiment, adhesive layer 480 has a thickness of between about 5 and 20 micrometers.

Figure 18:
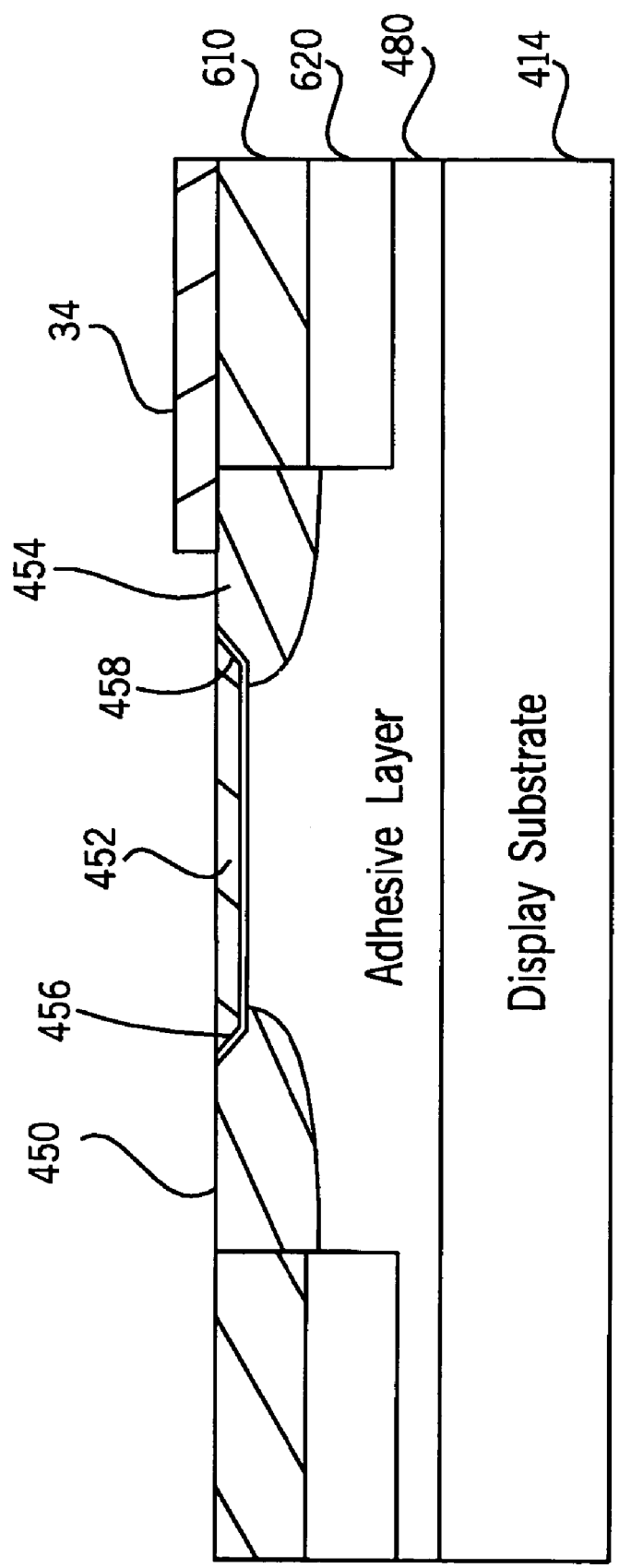
FIG. 18 is a sectional view schematically illustrating electrically coupling of an electrode to one of the second metal and the third metal according to one exemplary embodiment.

FIG. 17 illustrates separation of carrier substrate 612 and release layer 618. FIG. 18 illustrates the forming of electrode 34. In the particular example shown, electrode 34 is formed by depositing a transparent electrically conductive material in electrical contact with metal portion 454. In one embodiment, electrode 34 is formed from a doped polyethylenedioxythiophene dispersion known as PEDOT or PDOT available as Baytron "P" from Bayer Chemicals. The deposition of electrode 34 may be achieved utilizing coating methods such as spin-coating or lamination, and the patterning methods include laser patterning or laser ablation or other patterning techniques.

Figure 19:
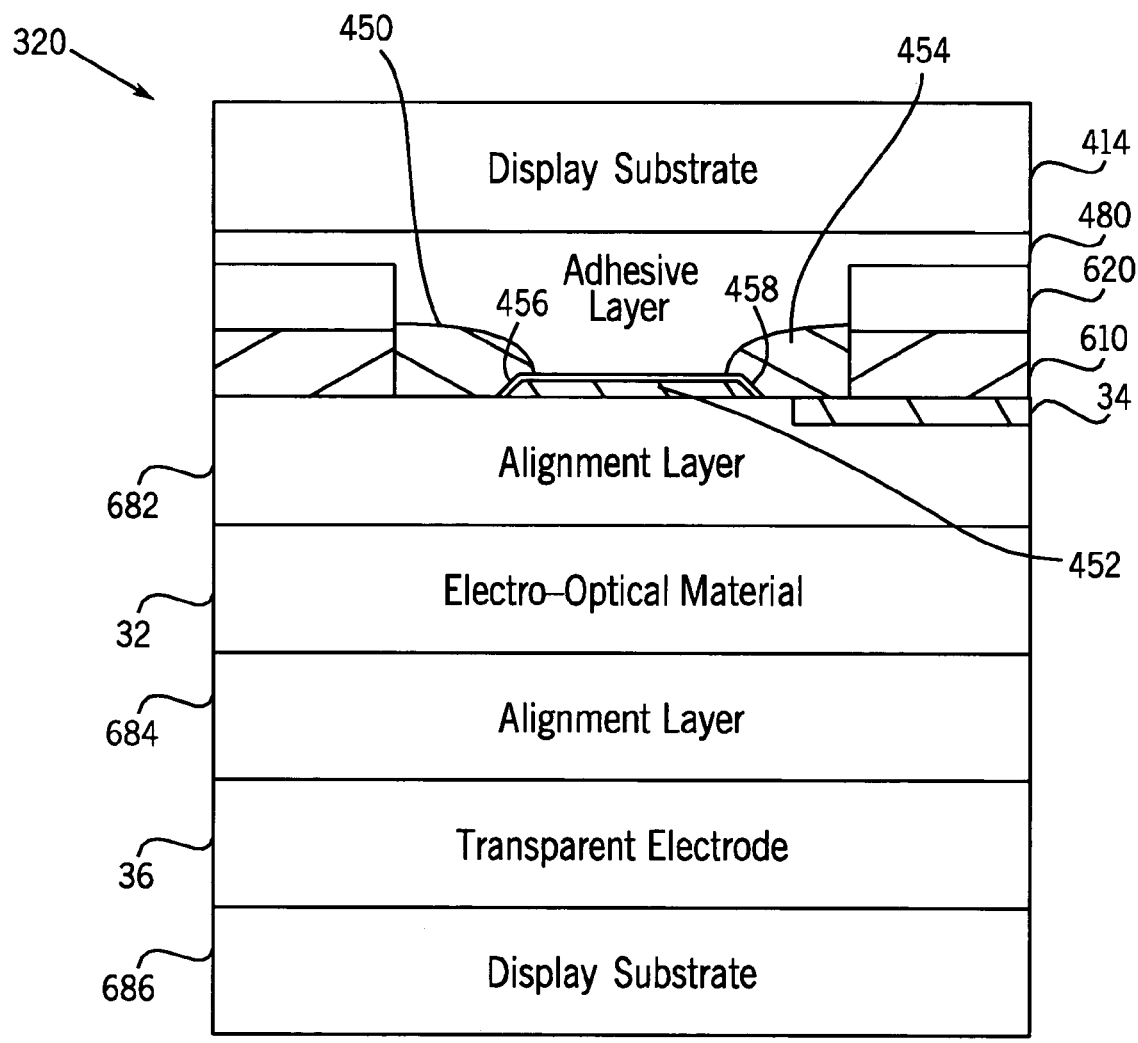
FIG. 19 is a sectional view schematically illustrating coupling of an electro-optical media to the formed backplane to form a display.

FIG. 19 illustrates further steps towards completing the illustrated portion of display 320 by adding alignment layer 682, electro-optical media 32, alignment layer 684, electrode or transparent conductor 36 and display substrate 686. In the example shown in FIG. 19, the electro-optical media 32 comprises liquid crystals and the molecular structure of electro-optical media 32 is aligned to the substrate of backplane 410 utilizing one or more alignment layers, barrier layers and other applied treatments, collectively represented as alignment layer 682. Electro-optical media 32 is also similarly aligned with display substrate 686 and transparent conductor 36 using one or more alignment layers, barrier layers and other treatments, collectively referred to as alignment layer 684.

Display substrate 686 supports electrode 36 and includes electrode patterning for electrode 36 which may or may not be similar to electrode 34. According to one embodiment, display substrate 686 may be formed in a similar manner to the formation of address line 438 and backplane 410 without the steps of anodizing portions of the metal layer to form non-linear dielectrics and without the addition of metal portion 452 between the non-linear dielectric portions. In other embodiments, display substrate 686 with electrode patterning may be formed in other manners.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method for forming a metal-insulator-metal (MIM) device, the method comprising:
  imprinting at least one first layer to form a first depression;
  removing a portion of at least one second layer through the first depression to form a recess in the at least one second layer bordered by a first side, a first overhang along the first side, a second opposite side and a second overhang along the second side;
  depositing a first metal in the recess spaced from the first side and the second side; and
  oxidizing the first metal to create a non-linear dielectric.

2. The method of claim 1 including separating the at least one second underlying layer from a carrier substrate layer.

3. The method of claim 1 including anodizing the first metal to oxidize the first metal.

4. The method of claim 1 including:
  forming a second metal on a first portion of the non-linear dielectric; and
  forming a third metal on a second portion of the non-linear dielectric, the third metal being spaced from the second metal.

5. The method of claim 4 including forming an electrically conductive layer on one of the second metal and the third metal.

6. The method of claim 4, wherein the second metal is formed by electroplating.

7. The method of claim 4, wherein the third metal is formed from electroplating.

8. The method of claim 6, wherein the electroplating voltage is below the conductive threshold of the non-linear dielectric.

9. The method of claim 4 including:
  imprinting the at least one layer to form a second depression in communication with the first depression, the second depression having a depth less than the first depression; and
  forming a fourth metal in the second depression, wherein the fourth metal extends adjacent to one of the second metal and the third metal.

10. The method a claim 1 including coupling a substrate to the second metal and the third metal.

11. The method of claim 10, wherein the substrate includes a flexible polymer.

12. The method of claim 10, wherein the substrate includes glass.

13. The method of claim 1, wherein the step of imprinting includes:
  positioning a shim into the first layer such that the first layer takes a form of the shim;
  treating the first layer to stabilize the form; and
  removing the shim from the first layer.

14. The method of claim 13, wherein the shim is substantially UV transparent, wherein the first layer is a UV curable material, wherein the shim is positioned into the first layer prior to complete curing of the material of the first layer and wherein treating includes applying UV illumination to the first layer through the shim.

15. The method of claim 1, wherein the first metal includes at least one of tantalum, niobium, titanium, copper, silver, aluminum, and alloys thereof.

16. The method of claim 1, wherein the first layer is transparent.

17. The method of claim 1 including coupling the first layer and the second layer to a carrier substrate.

18. The method of claim 17, wherein the carrier substrate is wrapped about two reels.

19. The method of claim. 17, wherein the carrier substrate is electrically conductive.

20. The method of claim 19, wherein charge is applied to the carrier substrate during anodization of the first metal.

21. The method of claim 19, including:
forming a second metal on a first portion of the non-linear dielectric; and
forming a third metal on a second portion of the non-linear dielectric, the third metal being spaced from the second metal, wherein charge is applied to the carrier substrate as the second metal and the third metal are formed by electroforming.

22. The method of claim 17 including:
forming a second metal on a first portion of the non-linear dielectric;
forming a third metal on a second portion of the non-linear dielectric, the third metal being spaced from the second metal; and
decoupling the carrier substrate from the first layer and the second layer after the forming of the second metal and the third metal.

23. A method for forming a metal-insulator-metal device, the method comprising:
imprinting at least one first layer to form a depression pattern having a first channel, a second channel, a third channel connecting the first channel and the second channel;
removing a first portion of the at least one second layer through the third channel;
removing a second portion of the at least one second layer through the third channel to create a first overhang along the side edges of the third channel;
depositing at least one first metal in the third channel; anodizing the at least one first metal to create a first non-linear dielectric in the third channel;
forming a second metal in the third channel and on a first portion of the first non-linear dielectric; and
forming a third metal in the third channel and on a second portion of the first non-linear dielectric, the third metal being spaced from the second metal.

24. The method of claim 23 including removing material to deepen the first channel through the at least one second layer after the step of anodizing and before the step of forming the second metal in the first channel.

25. The method of claim 23, wherein the step of forming the second metal in the first channel includes electroplating.

26. The method of claim 23, wherein the step of forming the second metal and the step of forming the third metal include electroplating.

27. The method of claim 26, wherein an electroplating voltage is below a conducting threshold of the first non-linear dielectric.

28. The method of claim 23 including coupling a substrate to the second metal and the third metal.

29. The method of claim 28, wherein the substrate includes a flexible polymer.

30. The method of claim 23, wherein the step of imprinting includes:
positioning a shim into the first layer such that the first layer takes a form of the shim;
treating the first layer to stabilize the form; and
removing the shim from the first layer.

31. The method of claim 30, wherein the shim is substantially UV transparent, wherein the first layer is a UV curable material, wherein the shim is positioned into the first layer prior to complete curing of the material of the first layer and wherein treating includes applying UV illumination to the first layer through the shim.

32. The method of claim 23, wherein the first layer is transparent.

33. The method of claim 23 including coupling the first layer and the second layer to a carrier substrate.

34. The method of claim 33, wherein the carrier substrate is wrapped about two reels.

35. The method of claim 33, wherein the carrier substrate is electrically conductive.

36. The method of claim 35, wherein charge is applied to the carrier substrate during anodization of the at least one first metal.

37. The method of claim 35, wherein charge is applied to the carrier substrate as the second metal and the third metal are formed by electroplating.

38. The method of claim 33 including decoupling the carrier substrate from the first layer and the second layer after the forming of the second metal and the third metal.

39. A method for forming a display, the method comprising:
imprinting at least one first layer to form a first depression;
removing a portion of at least one second layer through the first depression to form a recess in the at least one second layer bordered by a first side, a first overhang along the first side, a second opposite side and a second overhang along the second side;
depositing a first metal in the recess spaced from the first side and the second side;
anodizing the first metal to create a first metal conductive portion and a non-linear dielectric;
forming a second metal on a first portion of the non-linear dielectric;
forming a third metal on a second portion of the non-linear dielectric, the third metal being spaced from the second metal; and
electrically connecting one of the second metal and the third metal to electro-optical media.

40. The method of claim 39, wherein the step of electrically connecting includes forming a layer of electrically conductive material upon said one of the first metal conductive portion, the second metal and the third metal.

41. The method of claim 40, wherein the electrically conductive material is substantially transparent.

42. The method of claim 39, wherein the electro-optical media includes liquid crystals.

43. The method of claim 39 including coupling the first layer and the second layer to a carrier substrate.

44. The method of claim 43, wherein the carrier substrate is wrapped about two reels.

45. The method of claim 43, wherein the carrier substrate is electrically conductive.

46. The method of claim 45, wherein charge is applied to the carrier substrate during anodization of the first metal.

47. The method of claim 45, wherein charge is applied to the carrier substrate as the second metal and the third metal are formed by electroplating.

48. A metal-insulating-metal device formed by:
   imprinting at least one first layer to form a first depression;
   removing a portion of at least one second layer through the first depression to form a recess in the at least one second layer bordered by a first side, a first overhang along the first side, a second opposite side and a second overhang along the second side;
   depositing a first metal in the recess spaced from the first side and the second side; and
   oxidizing the first metal to create a non-Linear dielectric.

* * * * *